US011853519B2

(12) United States Patent
Yan et al.

(10) Patent No.: US 11,853,519 B2
(45) Date of Patent: Dec. 26, 2023

(54) TOUCH SUBSTRATE AND MANUFACTURING METHOD THEREFOR, TOUCH DISPLAY SUBSTRATE, AND TOUCH DISPLAY DEVICE

(71) Applicants: CHENGDU BOE OPTOELECTRONICS TECHNOLOGY CO., LTD., Sichuan (CN); BOE TECHNOLOGY GROUP CO., LTD., Beijing (CN)

(72) Inventors: Jun Yan, Beijing (CN); Xiangdan Dong, Beijing (CN); Fan He, Beijing (CN); Lingran Wang, Beijing (CN); Bo Cheng, Beijing (CN); Mengmeng Du, Beijing (CN); Bo Zhang, Beijing (CN)

(73) Assignees: CHENGDU BOE OPTOELECTRONICS TECHNOLOGY CO., LTD., Chengdu (CN); BOE TECHNOLOGY GROUP CO., LTD., Beijing (CN)

( * ) Notice: Subject to any disclaimer, the term of this patent is extended or adjusted under 35 U.S.C. 154(b) by 117 days.

(21) Appl. No.: 17/512,777

(22) Filed: Oct. 28, 2021

(65) Prior Publication Data
US 2022/0075479 A1 Mar. 10, 2022

Related U.S. Application Data

(63) Continuation of application No. 17/417,478, filed as application No. PCT/CN2020/115077 on Sep. 14, 2020, now Pat. No. 11,537,253.

(30) Foreign Application Priority Data

Nov. 15, 2019 (CN) .......................... 201911121001.0

(51) Int. Cl.
*G06F 3/044* (2006.01)
*G06F 3/041* (2006.01)

(52) U.S. Cl.
CPC .......... *G06F 3/0446* (2019.05); *G06F 3/0418* (2013.01); *G06F 3/04164* (2019.05);
(Continued)

(58) Field of Classification Search
CPC .. G06F 3/0446; G06F 3/04164; G06F 3/0418; G06F 2203/04102;
(Continued)

(56) References Cited

U.S. PATENT DOCUMENTS 9,904,418 B2 * 2/2018 Mu ........................ G06F 3/0445
10,152,147 B2 * 12/2018 Choi ..................... G06F 3/0443
(Continued)

FOREIGN PATENT DOCUMENTS

CN 103874318 A 6/2014
CN 104866126 A * 8/2015
(Continued)

OTHER PUBLICATIONS

International Search Report for related International application No. PCT/CN2020/115077, dated Nov. 30, 2020. 3 pages.
(Continued)

*Primary Examiner* — Amy Onyekaba
(74) *Attorney, Agent, or Firm* — Leason Ellis LLP

(57) ABSTRACT

Provided are a touch substrate and a touch display substrate. The touch substrate includes: a touch structure, including a sensor pattern and a touch line, the sensor pattern including a plurality of first sensor patterns and a plurality of second sensor patterns, and the touch line includes a plurality of first touch lines and a plurality of second touch lines, each first sensor pattern is connected with at least one of the first touch lines, and each second sensor pattern is connected with at
(Continued)

least one of the second touch lines; a first ground line located at a periphery of the touch structure; and at least one second ground line located at a side of the first ground line, wherein the first ground line and the at least one second ground line are connected at a side of the touch structure and are connected with one ground connection line.

26 Claims, 12 Drawing Sheets

(52) U.S. Cl.
CPC .............. *G06F 2203/04102* (2013.01); *G06F 2203/04103* (2013.01); *G06F 2203/04111* (2013.01)

(58) Field of Classification Search
CPC . G06F 2203/04103; G06F 2203/04111; G06F 3/0412; H05K 1/0259; H10K 59/40; G02F 1/13338
See application file for complete search history.

(56) References Cited

U.S. PATENT DOCUMENTS

| | | | |
|---|---|---|---|
| 10,318,055 B2 | 6/2019 | Ye | |
| 10,410,571 B2 | 9/2019 | Kurokawa | |
| 10,861,846 B2 | 12/2020 | Ma | |
| 2009/0262094 A1* | 10/2009 | Lin | H05K 1/026 345/174 |
| 2012/0075214 A1* | 3/2012 | Kim | G06F 3/041 345/173 |
| 2014/0043569 A1* | 2/2014 | Yabuta | G02F 1/1347 349/104 |
| 2014/0071064 A1* | 3/2014 | Cho | G06F 3/0443 345/173 |
| 2014/0138141 A1* | 5/2014 | Li | G06F 3/041 174/261 |
| 2014/0168149 A1 | 6/2014 | Han et al. | |
| 2015/0060256 A1* | 3/2015 | Kim | G06F 3/0446 200/600 |
| 2015/0223324 A1* | 8/2015 | Kim | G06F 3/0446 345/174 |
| 2016/0018348 A1* | 1/2016 | Yau | G06F 3/0443 324/697 |
| 2016/0124550 A1* | 5/2016 | Tada | G06F 3/041 345/173 |
| 2016/0149401 A1* | 5/2016 | Chen | H02H 9/04 361/56 |
| 2017/0060281 A1 | 3/2017 | Xie et al. | |
| 2017/0090650 A1* | 3/2017 | Jin | G06F 3/0443 |
| 2017/0262091 A1* | 9/2017 | Wang | G06F 3/04164 |
| 2017/0277320 A1 | 9/2017 | Choi et al. | |
| 2018/0033831 A1* | 2/2018 | An | H10K 50/84 |
| 2018/0323240 A1 | 11/2018 | Won et al. | |
| 2018/0335918 A1* | 11/2018 | Wang | G06F 3/0412 |
| 2019/0189644 A1* | 6/2019 | Wang | H03K 17/9622 |
| 2019/0350085 A1* | 11/2019 | Noma | H05K 3/0047 |
| 2019/0369787 A1* | 12/2019 | Park | G06F 3/0443 |
| 2019/0369832 A1* | 12/2019 | Sakaue | H05K 1/0259 |
| 2020/0133415 A1* | 4/2020 | Choi | G06F 3/0412 |
| 2020/0168671 A1* | 5/2020 | Jang | G06F 3/0412 |
| 2020/0203336 A1* | 6/2020 | Ren | H01L 23/528 |
| 2020/0278312 A1* | 9/2020 | Jeong | G01R 31/2837 |
| 2020/0393936 A1* | 12/2020 | Bok | H10K 59/131 |
| 2020/0401274 A1* | 12/2020 | Moon | G06F 3/04164 |
| 2020/0402447 A1* | 12/2020 | An | H01L 27/0248 |
| 2021/0328110 A1* | 10/2021 | Xia | G06F 3/04164 |

FOREIGN PATENT DOCUMENTS

| | | |
|---|---|---|
| CN | 104866126 A | 8/2015 |
| CN | 105183219 A | 12/2015 |
| CN | 105824461 A | 8/2016 |
| CN | 106024834 A | 10/2016 |
| CN | 106325601 A | 1/2017 |
| CN | 106527816 A | 3/2017 |
| CN | 106873835 A | 6/2017 |
| CN | 107464512 A | 12/2017 |
| CN | 108873507 A | 11/2018 |
| CN | 210377421 A | 4/2020 |
| JP | 2018036627 A | 3/2018 |
| WO | 2018010370 A1 | 1/2018 |

OTHER PUBLICATIONS

Extended European Search Report for corresponding European Application No. 20886920.6, dated Dec. 13, 2022.
Non-Final Office Action for related U.S. Appl. No. 17/417,478, dated Apr. 8, 2022.
Office Action issued by the Indian Patent Office in the corresponding Indian application No. 202217007082, dated of Jul. 15, 2022.

* cited by examiner

TOUCH SUBSTRATE AND MANUFACTURING METHOD THEREFOR, TOUCH DISPLAY SUBSTRATE, AND TOUCH DISPLAY DEVICE

CROSS-REFERENCE TO RELATED APPLICATION

The application is a continuation application of U.S. Ser. No. 17/417,478 filed on Jun. 23, 2021 which is a national stage application of international application PCT/CN2020/115077 filed on Sep. 14, 2020, which claims priority of the Chinese patent application No. 201911121001.0 filed on Nov. 15, 2019, the entire disclosure of which is incorporated herein by reference as part of embodiments of the present application.

TECHNICAL FIELD

At least one embodiment of the present disclosure relates to a touch substrate and a manufacturing method thereof, a touch display substrate and a touch display device.

BACKGROUND

With the rapid development of active-matrix organic light-emitting diode (AMOLED), the development of touch display devices, such as mobile phones, has entered the era of full screen and narrow frame. In order to bring better use experience to users, display devices with the characteristics of full screen, narrow frame, high resolution, being rollable and wearable, being foldable, etc., will become an important development direction of AMOLED display devices in the future.

SUMMARY

At least one embodiment of the present disclosure relates to a touch substrate and a manufacturing method thereof, a touch display substrate, and a touch display device, which can play the role of double protection, effectively alleviate or avoid the influence of static electricity on the touch line and sensor pattern, reduce the risk of touch failure caused by ESD, and achieve the purpose of improving the ability of preventing ESD, thereby avoiding the decline of product yield caused by ESD and achieving the purpose of increasing product yield.

At least one embodiment of the present disclosure provides a touch substrate, including: a touch structure, a first ground line, and at least one second ground line. The touch structure includes a sensor pattern and a touch line, the sensor pattern includes a plurality of first sensor patterns and a plurality of second sensor patterns, the plurality of first sensor patterns are intersected with and insulated from the plurality of second sensor patterns, and the touch line includes a plurality of first touch lines and a plurality of second touch lines, each of the plurality of first sensor patterns is connected with at least one of the first touch lines, and each of the plurality of second sensor patterns is connected with at least one of the second touch lines. The first ground line is located at a periphery of the touch structure. The at least one second ground line is located at a side of the first ground line facing away from the touch structure.

In one or more embodiments of the present disclosure, the second ground line and the first ground line are electrically connected at a side of the touch structure.

In one or more embodiments of the present disclosure, the first ground line is insulated from the touch structure, and the second ground line is insulated from the touch structure.

In one or more embodiments of the present disclosure, a width of the second ground line is equal to or greater than a width of the first ground line.

In one or more embodiments of the present disclosure, a maximum distance between the first ground line and the second ground line is in a range of 20-50 μm, and a distance between the first ground line and the touch line that is closest to the first ground line is in a range of 10-40 μm.

In one or more embodiments of the present disclosure, a width of the first ground line is in a range of 15-20 μm, and a width of the second ground line is in a range of 15-20 μm.

In one or more embodiments of the present disclosure, the first ground line is arranged around the touch structure, the second ground line is arranged around the first ground line, and the first ground line and the second ground line have a first interval.

In one or more embodiments of the present disclosure, the touch structure, the first ground line, and the at least one second ground line are located on a base substrate, the second ground line includes a first ground sub-line and a second ground sub-line, the first ground sub-line is closer to the base substrate than the second ground sub-line, an insulating layer is arranged between the first ground sub-line and the second ground sub-line, the first ground sub-line and the second ground sub-line are connected through a first via hole penetrating the insulating layer, and an orthographic projection of the first ground sub-line on the base substrate is at least partially overlapped with an orthographic projection of the second ground sub-line on the base substrate.

In one or more embodiments of the present disclosure, the touch substrate further includes a flexible printed circuit, both ends of the second ground line are connected with different pins of the flexible printed circuit.

In one or more embodiments of the present disclosure, the touch substrate further includes a third ground line, the first ground line and the second ground line have an opening at a side of the touch structure, the third ground line is located within the opening, and both ends of the third ground line are connected with different pins of the flexible printed circuit.

In one or more embodiments of the present disclosure, at least one of the first touch line and the second touch line includes a first touch sub-line and a second touch sub-line, the first touch sub-line is closer to the base substrate than the second touch sub-line, the insulating layer is arranged between the first touch sub-line and the second touch sub-line, the first touch sub-line and the second touch sub-line are connected through a second via hole penetrating the insulating layer, and an orthographic projection of the first touch sub-line on the base substrate is at least partially overlapped with an orthographic projection of the second touch sub-line on the base substrate.

In one or more embodiments of the present disclosure, one of the first sensor pattern and the second sensor pattern includes a main portion and a bridge line, one of the main portion and the bridge line is in a same layer as the first ground sub-line, and the other of the main portion and the bridge line is in a same layer as the second ground sub-line.

In one or more embodiments of the present disclosure, the other of the first sensor pattern and the second sensor pattern includes an integrally formed portion, and the integrally formed portion is in a same layer as the main portion.

In one or more embodiments of the present disclosure, the first ground line includes a third ground sub-line and a fourth ground sub-line, the third ground sub-line is closer to the base substrate than the fourth ground sub-line, the insulating layer is arranged between the third ground sub-line and the fourth ground sub-line, the third ground sub-line and the fourth ground sub-line are connected through a third via hole penetrating the insulating layer, and an orthographic projection of the third ground sub-line on the base substrate is at least partially overlapped with an orthographic projection of the fourth ground sub-line on the base substrate.

In one or more embodiments of the present disclosure, the bridge line, the first ground sub-line, the third ground sub-line, and the first touch sub-line are in a same layer, and the integrally formed portion, the main portion, the second ground sub-line, the fourth ground sub-line, and the second touch sub-line are in a same layer.

In one or more embodiments of the present disclosure, at least one selected from the group consisting of the bridge line, the integrally formed portion, and the main portion has a metal mesh structure.

In one or more embodiments of the present disclosure, a distance between the second ground line that is closest to the first ground line and the first ground line is less than a distance between the touch line that is closest to the first ground line and the first ground line.

In one or more embodiments of the present disclosure, a plurality of second ground lines are provided, and a distance between two adjacent second ground lines is less than a distance between the second ground line that is closest to the first ground line and the first ground line.

At least one embodiment of the present disclosure further provides a touch display substrate, including any one of the touch substrates described above.

In one or more embodiments of the present disclosure, the touch display substrate includes a display region and a peripheral region located outside the display region, and the at least one second ground line is located in the peripheral region.

In one or more embodiments of the present disclosure, the touch display substrate further includes a base substrate and an encapsulation film, the touch structure, the first ground line, and the at least one second ground line are located at a side of the encapsulation film facing away from the base substrate.

In one or more embodiments of the present disclosure, the encapsulation film includes a first film, a second film, and a third film, the second film is located between the first film and the third film, and the first film and the third film are in contact with each other at an edge to form a contacting part; and an orthographic projection of the at least one second ground line on the base substrate falls within an orthographic projection of the second film on the base substrate.

In one or more embodiments of the present disclosure, the encapsulation film includes a first film, a second film, and a third film, the second film is located between the first film and the third film, and the first film and the third film are in contact with each other at an edge to form a contacting part; and an orthographic projection of the at least one second ground line on the base substrate falls within an orthographic projection of the contacting part on the base substrate.

At least one embodiment of the present disclosure further provides a touch display device, including any one of the touch display substrates described above.

At least one embodiment of the present disclosure further provides a manufacturing method of a touch substrate, including: forming a first conductive film on a base substrate; patterning the first conductive film to form a first pattern, the first pattern including a bridge line, a first touch sub-line, a first ground sub-line, and a third ground sub-line; forming an insulating film; forming a first via hole, a second via hole, a third via hole, a fourth via hole, and a fifth via hole in the insulating film; forming a second conductive film; and patterning the second conductive film to form a second pattern, the second pattern including a second touch sub-line, a second ground sub-line, a fourth ground sub-line, an integrally formed portion, and a main portion, the first ground sub-line and the second ground sub-line are connected through the first via hole to form a second ground line, the first touch sub-line and the second touch sub-line are connected through the second via hole to form a touch line, the third ground sub-line and the fourth ground sub-line are connected through the third via hole to form a first ground line, and adjacent main portions are connected with the bridge line through the fourth via hole and the fifth via hole, respectively.

In one or more embodiments of the present disclosure, the first pattern further includes a fifth ground sub-line, a sixth via hole is further formed in the insulating film, the second pattern further includes a sixth ground sub-line, and the fifth ground sub-line and the sixth ground sub-line are connected through the sixth via hole to form a third ground line.

BRIEF DESCRIPTION OF THE DRAWINGS

In order to clearly illustrate the technical solutions of the embodiments of the present disclosure, the drawings of the embodiments will be briefly described in the following; it is obvious that the described drawings are only related to some embodiments of the present disclosure and thus are not construed as any limitation to the present disclosure.

DETAILED DESCRIPTION

In order to make objectives, technical details, and advantages of the embodiments of the present disclosure more clear, the technical solutions of the embodiments will be described in a clearly and fully understandable way in connection with the drawings related to the embodiments of the present disclosure. It is obvious that the described embodiments are just a part but not all of the embodiments of the present disclosure. Based on the described embodiments herein, a person having ordinary skill in the art may obtain other embodiment(s), without any inventive work, which should be within the scope of the present disclosure.

Unless otherwise defined, the technical terms or scientific terms used in the present disclosure have the same meanings as commonly understood by one of ordinary skill in the art to which the present disclosure belongs. The terms "first", "second", etc., which are used in the present disclosure, are not intended to indicate any sequence, amount, or importance, but distinguish various components. Also, the terms "comprises", "comprising", "includes", "including", etc., are intended to specify that the elements or the objects stated before these terms encompass the elements or the objects and equivalents thereof listed after these terms, but do not preclude the other elements or objects. The phrases "connect", "connected", etc., are not intended to define a physical connection or mechanical connection, but may include an electrical connection, directly or indirectly. "On," "under," "right," "left" and the like are only used to indicate relative position relationship, and when the position of the described object is changed, the relative position relationship may be changed accordingly.

Touch technology such as flexible multi-layer on cell (FMLOC) touch technology was born in order to realize lighter weight, thinner thickness and narrower frame of touch display panel to adapt to foldable and rollable products. In touch display devices, static electricity easily leads to touch failure and causes touch defect. Static electricity includes, but is not limited to, static electricity generated during manufacture or use.

Figure 1:
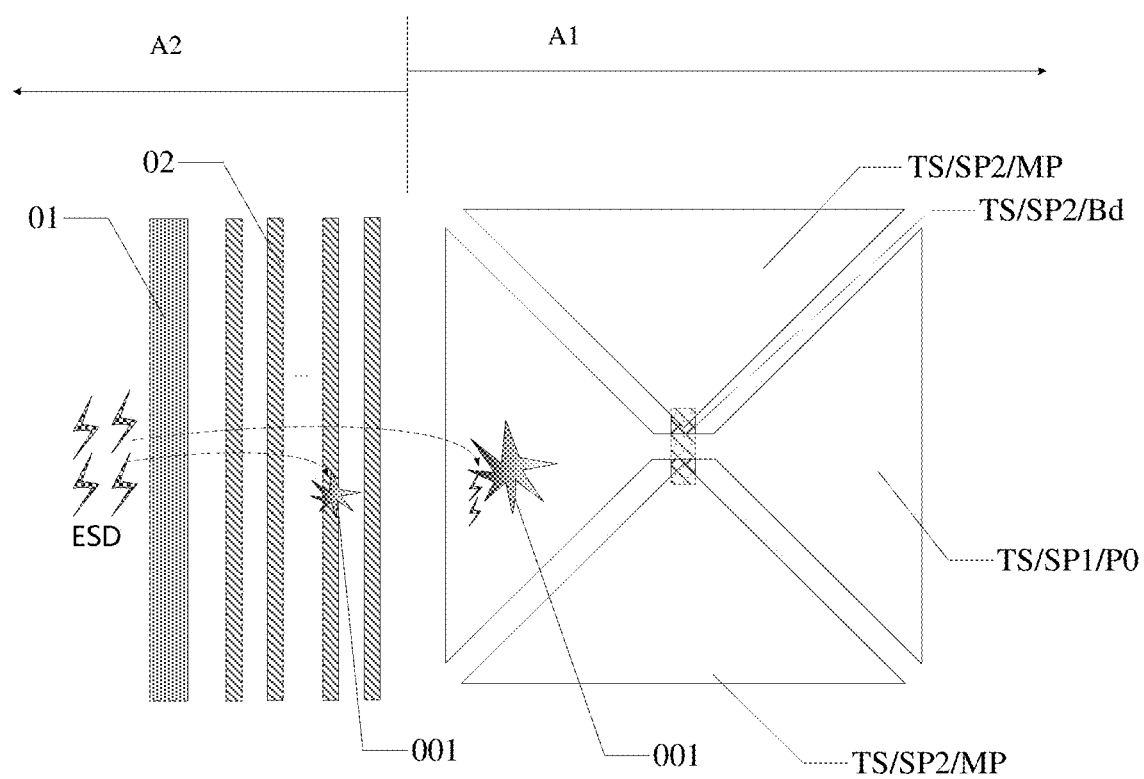
FIG. 1 is a plan view illustrating a display substrate provided by an embodiment of the present disclosure.

FIG. 1 is a plan view illustrating a display substrate provided by an embodiment of the present disclosure. With regard to the panel design of FMLOC touch technology, in terms of preventing electro-static discharge (ESD), a single ground line 01 (i.e., GND line with a voltage of 0V) can be designed around the panel to achieve the purpose of releasing static electricity. In the embodiments of the present disclosure, the voltages of the ground lines are all 0V.

Although a single ground line can obstruct ESD to a certain extent, there is also the risk that static electricity jumps over the ground line 01, enters the trace line 02 in the peripheral region A2 or the touch structure (touch pattern) TS in the display region (active area) A1, thereby damaging the trace line 02 or the touch structure TS, and resulting in touch failure, as illustrated in FIG. 1. A possible damaged region 001 is illustrated in FIG. 1. The region where the display region A1 is located is also a touch region.

As illustrated in FIG. 1, the touch structure TS includes a first sensor pattern SP1 and a second sensor pattern SP2, the first sensor pattern SP1 and the second sensor pattern SP2 are insulated from each other and intersected with each other, the first sensor pattern SP1 includes an integrally formed portion P0, and the second sensor pattern SP2 includes a plurality of main portions MP and a bridge line Bd connecting adjacent main portions MP. The main portions MP and the first sensor pattern SP1 can be formed by performing one single patterning process on a same film layer, and the bridge line Bd can be formed by performing another patterning process on another film layer. An insulating layer can be arranged between the bridge line Bd and the first sensor pattern SP1.

Figure 2:
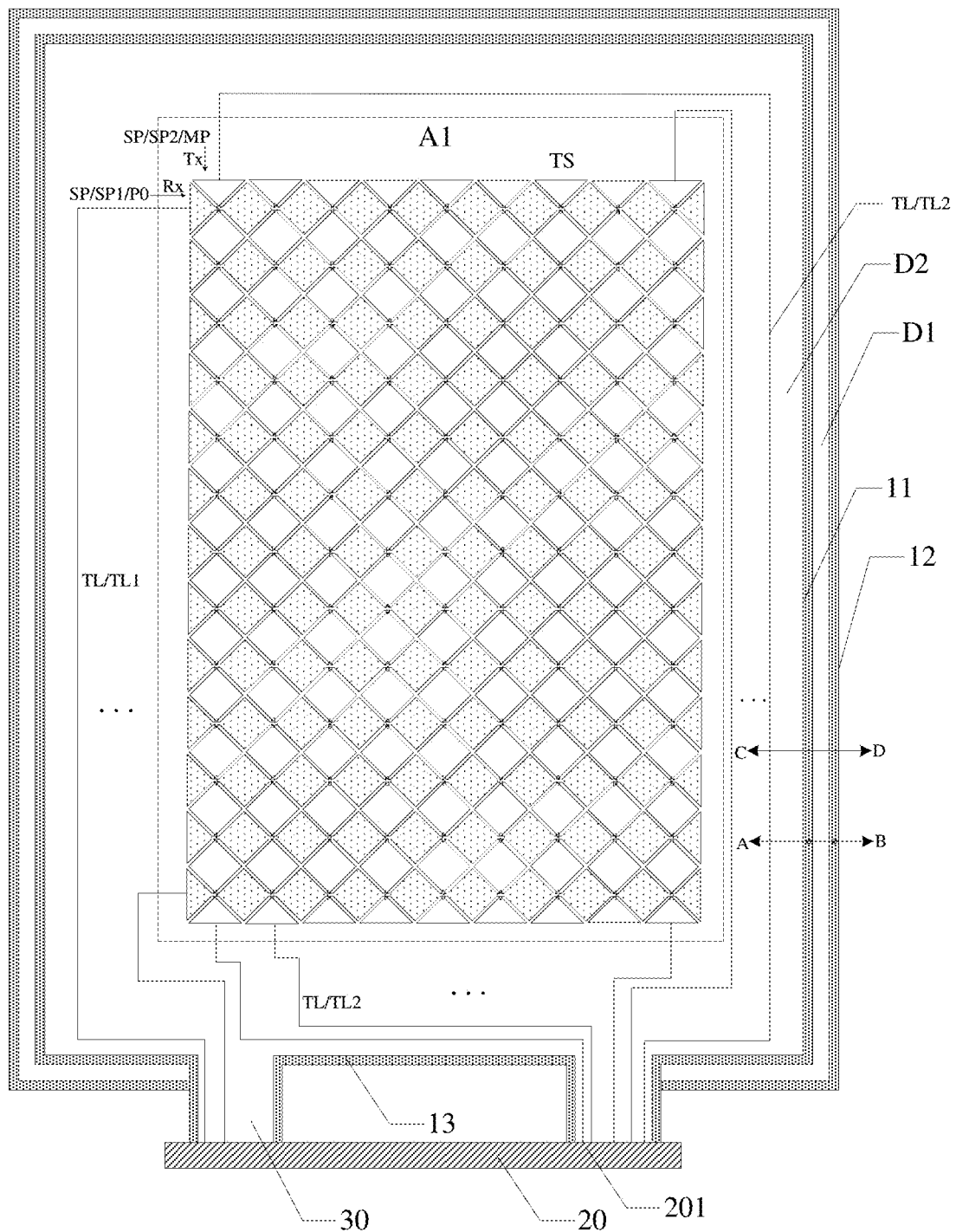
FIG. 2 is a schematic plan view illustrating a touch substrate provided by an embodiment of the present disclosure.

FIG. 2 is a schematic plan view illustrating a touch substrate provided by an embodiment of the present disclosure. As illustrated in FIG. 2, the touch substrate 10 includes a touch structure TS, a first ground line 11, and at least one second ground line 12. The embodiment illustrated in FIG. 2 is illustrated with reference to the case where one second ground line 12 is provided, by way of example, and in other embodiments, a plurality of second ground lines 12 can also be provided. The touch structure TS, the first ground line 11, and the second ground line 12 are located on a base substrate.

For example, as illustrated in FIG. 2, the touch structure TS includes a sensor pattern SP and a touch line TL. The sensor pattern SP includes a first sensor pattern SP1 and a second sensor pattern SP2, and the first sensor pattern SP1 and the second sensor pattern SP2 are insulated from each other. The first sensor pattern SP1 and the second sensor pattern SP2 are intersected with each other. For example, the first sensor pattern SP1 is perpendicular to the second sensor pattern SP2, but is not limited thereto. For example, an extending direction of the first sensor pattern SP1 is intersected with an extending direction of the second sensor pattern SP2. For example, the extending direction of the first sensor pattern SP1 is perpendicular to the extending direction of the second sensor pattern SP2, but is not limited thereto. For example, an extending direction of an element may refer to the general trend or direction of the element, but is not limited thereto. For example, as illustrated in FIG. 2, the touch line TL includes a first touch line TL1 and a second touch line TL2. For example, as illustrated in FIG. 2, the first sensor pattern SP1 is connected with the first touch line TL1, and the second sensor pattern SP2 is connected with the second touch line TL2. For the sake of clarity, some touch lines TL are schematically illustrated in FIG. 2.

In the touch substrate provided by the embodiment of the present disclosure, by providing the second ground line, peripheral static electricity is firstly released by the second ground line, and static electricity that jumps over the second ground line is released by the first ground line, which can play a role of double protection, effectively reduce or avoid the influence of static electricity on the touch line and the sensor pattern, reduce the risk of touch failure caused by ESD, and achieve the purpose of improving the ability of preventing ESD, thereby avoiding the decline of product yield caused by ESD and achieving the purpose of improving product yield.

For example, as illustrated in FIG. 2, the second ground line 12 and the first ground line 11 are electrically connected at a side of the touch structure TS, but not limited thereto. For example, as illustrated in FIG. 2, the second ground line 12 and the first ground line 11 are electrically connected at a side of the touch structure TS after the touch lines TL are gathered. Of course, in the embodiment of the present disclosure, the second ground line 12 and the first ground line 11 can also be electrically connected by a connection line at any other position. For example, as illustrated in FIG. 2, the first ground line 11 and the second ground line 12 are insulated from the touch structure TS, respectively. That is, the first ground line 11 is insulated from the touch structure TS, and the second ground line 12 is insulated from the touch structure TS.

As illustrated in FIG. 2, the first ground line 11 is located at a periphery of the touch structure TS. The at least one second ground line 12 is located at a side of the first ground line 11 facing away from the touch structure TS. That is, in a plane parallel with a surface of the base substrate, the second ground line 12 is located at a side of the first ground line 11 facing away from the touch control structure TS. For example, the plane parallel with the surface of the base substrate is the surface of the base substrate for manufacturing various elements thereon. In the embodiment of the present disclosure, element A being located at a periphery of element B refers to that element A is located at the periphery of element B in a plan view. Element A and element B can have the same height with respect to the base substrate, that is, the distance from element A to the base substrate is equal to the distance from element B to the base substrate, but not limited thereto. The distance from element A to the base substrate may be unequal to the distance from element B to the base substrate.

The embodiment illustrated in FIG. 2 is illustrated with reference to the case where the first sensor pattern SP1 extends in the horizontal direction and the second sensor pattern SP2 extends in the vertical direction, by way of example, but is not limited thereto. The embodiment illustrated in FIG. 2 is illustrated with reference to the case where the first sensor pattern SP1 is a receiving sensor (Rx) and the second sensor pattern SP2 is a transmitting sensor (Tx), by way of example, but is not limited thereto, and in other embodiments, they can be interchanged. That is, in some embodiments, the first sensor pattern SP1 is a transmitting sensor (Tx) and the second sensor pattern SP2 is a receiving sensor (Rx).

A plurality of first sensor patterns SP1 and a plurality of second sensor patterns SP2 are illustrated in FIG. 2. The plurality of first sensor patterns SP1 are intersected with and insulated from the plurality of second sensor patterns SP2. One of the left and right ends of each first sensor pattern SP1 is connected with one first touch line TL1, or each first sensor pattern SP1 is connected with two first touch lines TL1 at the left and right ends of the first sensor pattern SP1. One of the upper and lower ends of each second sensor pattern SP2 is connected with one second touch line TL2, or each second sensor pattern SP2 is connected with two second touch lines TL2 at the upper and lower ends of the second sensor pattern SP2. The embodiment illustrated in FIG. 2 is illustrated with reference to the case where the left end of each first sensor pattern SP1 is connected with one first touch line TL1 and each second sensor pattern SP2 is connected with two second touch lines TL2 at the upper and lower ends of the second sensor pattern SP2, by way of example.

For example, as illustrated in FIG. 2, the touch substrate 10 further includes a flexible printed circuit 20, and both ends of the second ground line 12 are connected with different pins of the flexible printed circuit (FPC) 20. For example, as illustrated in FIG. 2, the second ground line 12 and the first ground line 11 are electrically connected at a position close to the FPC 20. For example, as illustrated in FIG. 2, the second ground line 12 and the first ground line 11 are electrically connected at a side of the touch structure TS close to the FPC 20. For example, both ends of the second ground line 12 are electrically connected, at a side of the touch structure TS, with both ends of the first ground line 11, respectively. The first ground line 11 and the second ground line 12 can be led out to pads, respectively, and these pads are bonded to different pins of the flexible printed circuit 20, respectively. For example, the second ground line 12 and the first ground line 11 are electrically connected at a side of the touch structure TS close to the pad of the touch line TL. FIG. 2 illustrates that the FPC 20 includes a plurality of pins 201. For example, different pins of the flexible printed circuit 20 can be insulated from each other so that signals can be transmitted separately. For example, each pin 201 may correspond to a pad and be connected with the pad.

For example, as illustrated in FIG. 2, one of the first sensor pattern SP1 and the second sensor pattern SP2 includes a main portion MP and a bridge line Bd, and the other of the first sensor pattern SP1 and the second sensor pattern SP2 includes an integrally formed portion P0. Two adjacent main portions MP in the plurality of main portions MP are connected through one bridge line Bd. For example, as illustrated in FIG. 2, adjacent main portions MP included in the same first sensor pattern SP1 are disposed at opposite sides of one second sensor pattern SP2, respectively. For example, as illustrated in FIG. 2, adjacent main portions MP included in the same first sensor pattern SP1 are disposed at the upper side and the lower side of one second sensor pattern SP2, respectively. A plurality of main portions MP and the integrally formed portions P0 can be located in the same layer and be formed by performing one single patterning process on the same film layer, and the bridge line Bd is located in another layer. FIG. 2 is illustrated with reference to the case where the first sensor pattern SP1 is integrally formed and the second sensor pattern SP2 is formed in segments, by way of example. In other embodiments, it can be the case that the second sensor pattern SP2 is integrally formed and the first sensor pattern SP1 is formed in segments.

For example, in order to better play the role of electro-static protection, a width of the second ground line 12 is equal to or greater than a width of the first ground line 11, but is not limited thereto. In other embodiments, the width of the second ground line 12 may be less than the width of the first ground line 11.

For example, the width of the first ground line 11 is in the range of 15-20 μm, the width of the second ground line 12 is in the range of 15-20 μm, the maximum distance between the first ground line 11 and the second ground line 12 is in the range of 20-50 μm, and the distance between the first ground line 11 and the touch line TL that is closest to the first ground line 11 is in the range of 10-40 μm. In the embodiment of the present disclosure, the width of the ground line or the touch line is the size thereof in the direction perpendicular to the extending direction thereof.

For example, as illustrated in FIG. 2, the first ground line 11 is arranged around the touch structure TS, and the second ground line 12 is arranged around the first ground line 11. For example, as illustrated in FIG. 2, the second ground line 12 is arranged around the touch structure TS, and the first ground line 11 is arranged around the touch structure TS. For example, the second ground line 12 is arranged around both the sensor pattern SP and the touch line TL, and the first ground line 11 is arranged around the sensor pattern SP and the touch line TL. For example, as illustrated in FIG. 2, the first ground line 11 and the second ground line 12 have an opening 30 at a side of the touch structure TS. As illustrated in FIG. 2, the opening 30 is located at the lower side of the touch structure TS.

For example, as illustrated in FIG. 2, in order to further play the role of electro-static protection, the touch substrate further includes a third ground line 13, and the third ground line 13 is located at the opening 30. For example, the third ground line 13 is located within the opening 30. For example, both ends of the third ground line 13 are connected with different pins of the flexible printed circuit (FPC) 20.

For example, the third ground line 13 is located between the first touch line TL1 and the second touch line TL2. For example, the third ground line 13 is located between a pin of the FPC 20 connected with the first touch line TL1 and a pin of the FPC 20 connected with the second touch line TL2.

In some embodiments of the present disclosure, in order to reduce resistance of the line, at least one selected from the group consisting of the first ground line 11, the second ground line 12, and the touch line TL can be formed by two sub-lines which are connected and overlapped with each other in the direction perpendicular to the base substrate, that is, a design in which a line is formed of double-layer sub-lines can be adopted.

Figure 3:
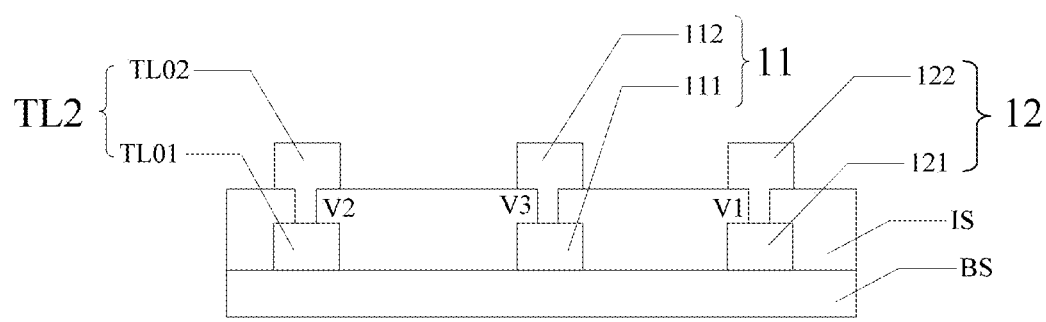
FIG. 3 is a cross-sectional view taken along line A-B in FIG. 2.
Figure 4:
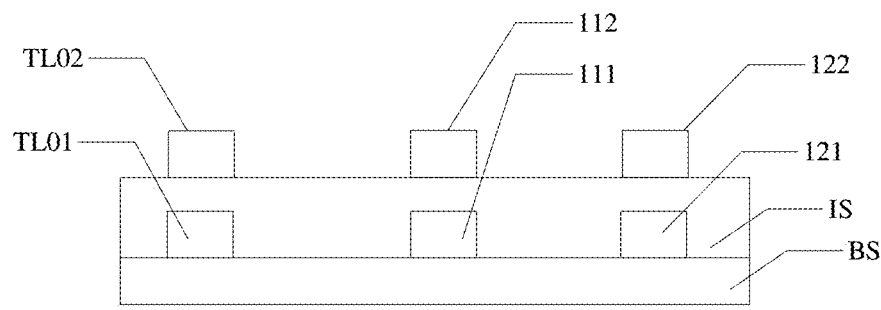
FIG. 4 is a cross-sectional view taken along line C-D in FIG. 2.

FIG. 3 is a cross-sectional view taken along line A-B in FIG. 2. FIG. 4 is a cross-sectional view taken along line C-D in FIG. 2. The following description will be made with reference to FIG. 2, FIG. 3, and FIG. 4.

For example, as illustrated in FIG. 3 and FIG. 4, in order to reduce resistance of the line, the second ground line 12 includes a first ground sub-line 121 and a second ground sub-line 122, an insulating layer IS is arranged between the first ground sub-line 121 and the second ground sub-line 122, and the first ground sub-line 121 and the second ground sub-line 122 are connected through a first via hole V1 penetrating the insulating layer IS. A plurality of first via holes V1 are distributed in the insulating layer IS, and the first ground sub-line 121 and the second ground sub-line 122 are connected at predetermined positions through the plurality of first via holes V1. That is, the first ground sub-line 121 and the second ground sub-line 122 are connected in parallel. FIG. 3 is a cross-sectional view at a position where the first via hole is provided in the insulating layer IS, and FIG. 4 is a cross-sectional view at a position where the first via hole is not provided in the insulating layer IS.

For example, as illustrated in FIG. 3 and FIG. 4, an orthographic projection of the first ground sub-line 121 on the base substrate BS is at least partially overlapped with an orthographic projection of the second ground sub-line 122 on the base substrate BS. In some embodiments, the orthographic projection of the first ground sub-line 121 on the base substrate BS coincides with the orthographic projection of the second ground sub-line 122 on the base substrate BS, but is not limited thereto. For example, as illustrated in FIG. 4, the first ground sub-line 121 is closer to the base substrate BS than the second ground sub-line 122. For example, as illustrated in FIG. 4, the first ground sub-line 121 is in contact with the second ground sub-line 122.

For example, in order to reduce resistance of the line, as illustrated in FIG. 3 and FIG. 4, the touch line TL (the second touch line TL2) includes a first touch sub-line TL01 and a second touch sub-line TL02, the insulating layer IS is arranged between the first touch sub-line TL01 and the second touch sub-line TL02, and the first touch sub-line TL01 and the second touch sub-line TL02 are connected through a second via hole V2 penetrating the insulating layer IS. A plurality of second via holes V2 are distributed in the insulating layer IS, and the first touch sub-line TL01 and the second touch sub-line TL02 are connected at predetermined positions through the plurality of second via holes V2. That is, the first touch sub-line TL01 and the second touch sub-line TL02 are connected in parallel. FIG. 3 is a cross-sectional view at a position where the second via hole is provided in the insulating layer IS, and FIG. 4 is a cross-sectional view at a position where the second via hole is not provided in the insulating layer IS. The first touch line TL1 can also adopt the same structure as the second touch line TL2.

For example, as illustrated in FIG. 3 and FIG. 4, the first touch sub-line TL01 is closer to the base substrate BS than the second touch sub-line TL02. For example, as illustrated in FIG. 3 and FIG. 4, an orthographic projection of the first touch sub-line TL01 on the base substrate BS is at least partially overlapped with an orthographic projection of the second touch sub-line TL02 on the base substrate BS. In some embodiments, the orthographic projection of the first touch sub-line TL01 on the base substrate BS coincides with the orthographic projection of the second touch sub-line TL02 on the base substrate BS, but is not limited thereto. For example, as illustrated in FIG. 4, the first touch sub-line TL01 is in contact with the second touch sub-line TL02.

For example, as illustrated in FIG. 3 and FIG. 4, in order to reduce resistance of the line, the first ground line 11 includes a third ground sub-line 111 and a fourth ground sub-line 112, the insulating layer IS is arranged between the third ground sub-line 111 and the fourth ground sub-line 112, and the third ground sub-line 111 and the fourth ground sub-line 112 are connected through a third via hole V3 penetrating the insulating layer IS. A plurality of third via holes V3 are distributed in the insulating layer IS, and the third ground sub-line 111 and the fourth ground sub-line 112 are connected at predetermined positions through the plurality of third via holes V3. That is, the third ground sub-line 111 and the fourth ground sub-line 112 are connected in parallel. FIG. 3 is a cross-sectional view at a position where the third via hole is provided in the insulating layer IS, and FIG. 4 is a cross-sectional view at a position where the third via hole is not provided in the insulating layer IS.

For example, as illustrated in FIG. 3 and FIG. 4, the third ground sub-line 111 is closer to the base substrate BS than the fourth ground sub-line 112. For example, as illustrated in FIG. 3 and FIG. 4, an orthographic projection of the third ground sub-line 111 on the base substrate BS is at least partially overlapped with an orthographic projection of the fourth ground sub-line 112 on the base substrate BS. In some embodiments, the orthographic projection of the third ground sub-line 111 on the base substrate BS coincides with the orthographic projection of the fourth ground sub-line 112 on the base substrate BS, but is not limited thereto. For example, as illustrated in FIG. 4, the third ground sub-line 111 is in contact with the fourth ground sub-line 112.

Figure 5:
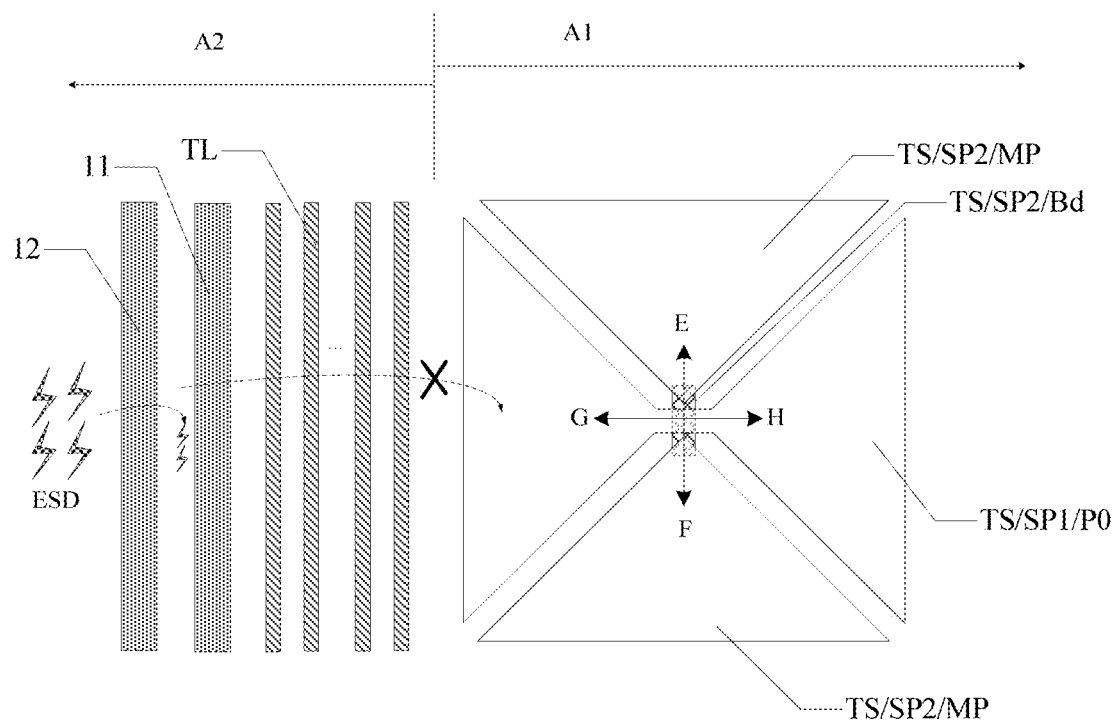
FIG. 5 is a schematic diagram of the principle of double protection against ESD in a touch substrate provided by an embodiment of the present disclosure.

FIG. 5 is a schematic diagram of the principle of double protection against ESD in a touch substrate provided by an embodiment of the present disclosure. FIG. 5 is a schematic structural diagram of part of the touch substrate in FIG. 2. FIG. 5 illustrates the touch line TL.

Referring to FIG. 2 and FIG. 5, in the touch substrate provided by the embodiment of the present disclosure, at least one second ground line 12 is provided at a certain distance from the first ground line 11, and the peripheral static electricity is firstly released by the second ground line 12, and the static electricity that jumps over the second ground line 12 is released by the first ground line 11, thus playing a role of double protection on the touch line TL and the touch structure TS, reducing the risk of touch failure caused by ESD, achieving the purpose of improving the ability of preventing ESD, and further avoiding the decline of product yield caused by ESD and achieving the purpose of improving product yield.

Figure 6:
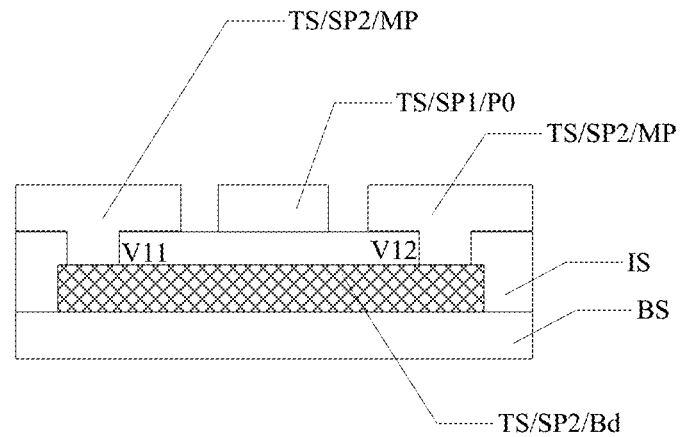
FIG. 6 is a cross-sectional view taken along line E-F in FIG. 5.
Figure 7:
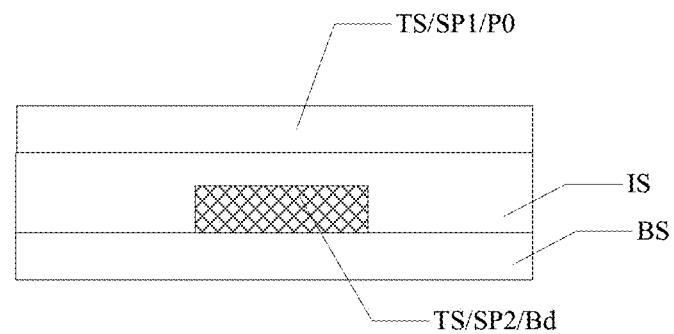
FIG. 7 is a cross-sectional view taken along line G-H in FIG. 5.

FIG. 6 is a cross-sectional view taken along line E-F in FIG. 5, and FIG. 7 is a cross-sectional view taken along line G-H in FIG. 5. For example, as illustrated in FIG. 6, the integrally formed portion P0 is disposed in the same layer as the main portion MP. For example, the integrally formed portion P0 and the main portion MP have a metal mesh structure, but are not limited thereto.

For example, as illustrated in FIG. 5 and FIG. 6, two adjacent main portions MP are connected with the bridge line Bd through the fourth via hole V11 and the fifth via hole V12, respectively.

For example, in order to simplify the manufacturing process, one of the main portion MP and the bridge line Bd is in the same layer as the first ground sub-line 121, and the other of the main portion MP and the bridge line Bd is in the same layer as the second ground sub-line 122.

For example, the touch substrate provided by the embodiment of the present disclosure can be formed by the following method.
- (1) Forming a first conductive film on a base substrate BS, and patterning the first conductive film to form a bridge line Bd, a first touch sub-line TL01, a first ground sub-line 121, and a third ground sub-line 111.
- (2) Forming an insulating film.
- (3) Forming a first via hole V1, a second via hole V2, a third via hole V3, a fourth via hole V11, and a fifth via hole V12 in the insulating film to form an insulating layer IS.
- (4) forming a second conductive film, patterning the second conductive film to form a second touch sub-line TL02, a second ground sub-line 122, a fourth ground sub-line 112, an integrally formed portion P0, and a main portion MP; the first ground sub-line 121 and the second ground sub-line 122 are connected through the first via hole V1, the first touch sub-line TL01 and the second touch sub-line TL02 are connected through the second via hole V2, the third ground sub-line 111 and the fourth ground sub-line 112 are connected through the third via V3, and adjacent main portions MP are connected with the bridge line Bd through the fourth via hole V11 and the fifth via hole V12, respectively.

For example, the first conductive film and the second conductive film can be made of a metal material, the integrally formed portions P0 and the main portions MP can be formed with a metal mesh structure, the bridge lines Bd can be formed with a metal mesh structure, and other structures formed by patterning the first conductive film or the second conductive film may be formed with or may not be formed with a metal mesh structure.

Figure 8:
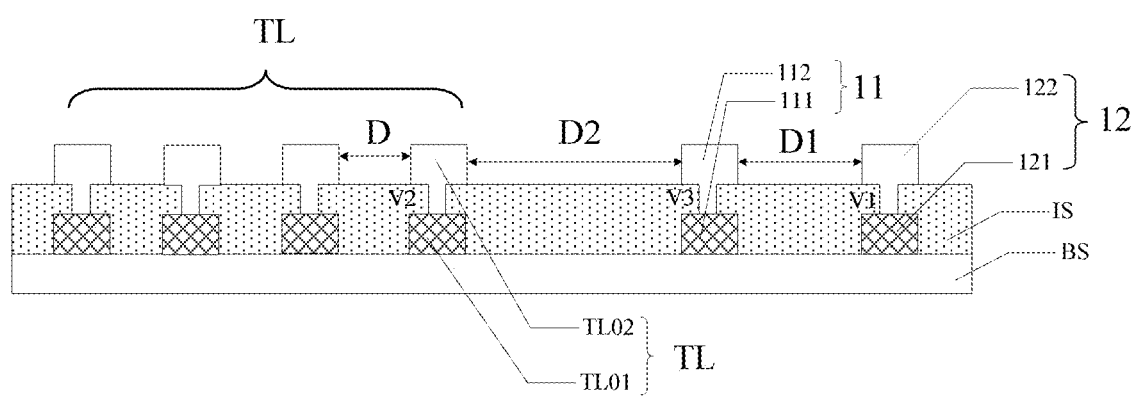
FIG. 8 is a partial cross-sectional view illustrating a touch substrate provided by another embodiment of the present disclosure.

FIG. 8 is a partial cross-sectional view illustrating a touch substrate provided by another embodiment of the present disclosure. As illustrated in FIG. 8, the touch substrate includes a first ground line 11, a second ground line 12, and a plurality of touch lines TL, the touch line TL includes a first touch sub-line TL01 and a second touch sub-line TL02, and the first touch sub-line TL01 and the second touch sub-line TL02 are connected through a second via hole V2 penetrating the insulating layer IS. FIG. 8 illustrates four touch lines TL. The number of touch lines TL in the touch substrate can be determined as needed.

Referring to FIG. 2 and FIG. 8, a distance between the second ground line 12 that is closest to the first ground line 11 and the first ground line 11 is a first distance D1, a distance between the touch line TL that is closest to the first ground line 11 and the first ground line 11 is a second distance D2, and in order to improve the electro-static protection effect, the first distance D1 is less than the second distance D2.

For example, in order to improve the electro-static protection effect, as illustrated in FIG. 8, a distance D between adjacent touch lines TL is less than the second distance D2. For example, as illustrated in FIG. 8, the distance D between adjacent touch lines TL is less than the first distance D1, but is not limited thereto. For example, the distance D between every two adjacent touch lines TL is equal, but not limited thereto.

Figure 9:
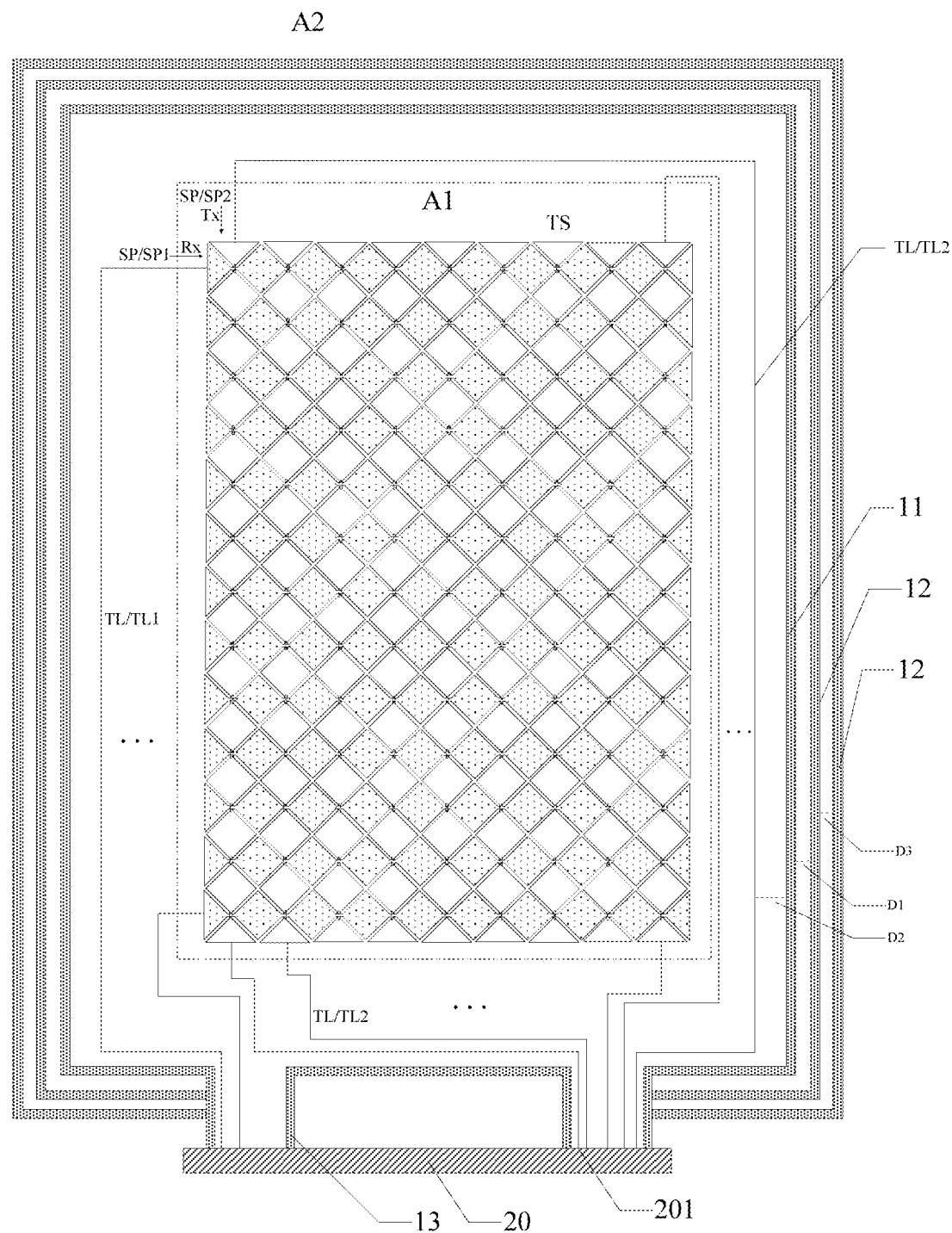
FIG. 9 is a schematic plan view illustrating a touch substrate provided by another embodiment of the present disclosure.

FIG. 9 is a schematic plan view illustrating a touch substrate provided by another embodiment of the present disclosure. Compared with the touch substrate illustrated in FIG. 2, the touch substrate illustrated in FIG. 9 is provided with a plurality of second ground lines 12, and the touch substrate illustrated in FIG. 9 is illustrated with reference to the case where two second ground lines 12 are provided, by way of example. The plurality of second ground lines 12 can all be electrically connected with the first ground line 11. A distance between two adjacent second ground lines 12 is a third distance D3, and the third distance D3 is less than the first distance D1, so that both electro-static prevention and narrow frame design can be considered at the same time. Of course, in other embodiments, the third distance D3 may be greater than or equal to the first distance D1.

Figure 10:
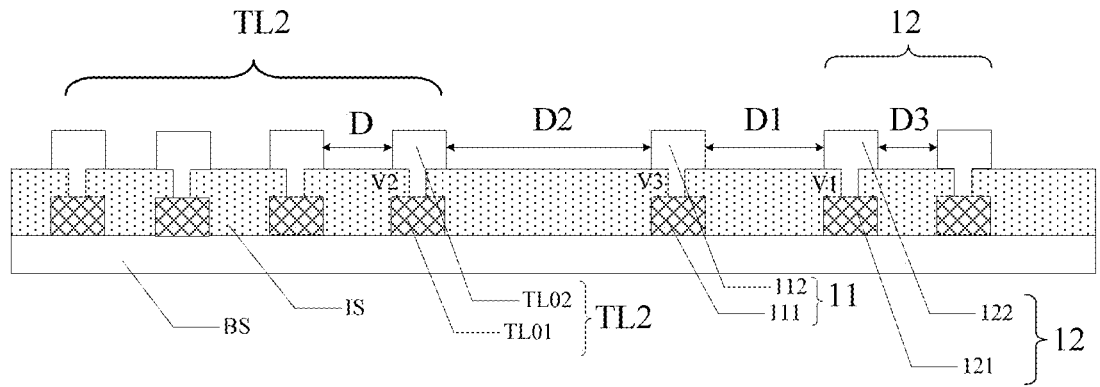
FIG. 10 is a partial cross-sectional view illustrating a touch substrate provided by an embodiment of the present disclosure.

FIG. 10 is a partial cross-sectional view illustrating a touch substrate provided by an embodiment of the present disclosure. Referring to FIG. 8 and FIG. 10, the distance between adjacent second ground lines 12 is a third distance D3, the third distance D3 is less than the first distance D1, and the third distance D3 is less than the second distance D2.

At least one embodiment of the present disclosure further provides a touch display substrate, which includes any one of the above touch substrates.

For example, as illustrated in FIG. 2, the touch display substrate includes a display region A1 and a peripheral region A2 located outside the display region A1, and the at least one second ground line 12 is located in the peripheral region A2. The region within the dashed box in FIG. 2 is the display region A1, and the region other than the display region A1 is the peripheral region A2. The peripheral region A2 surrounds the display region A1.

In order to realize the lighter and thinner design of a display device (e.g., an organic light emitting diode display device), a display panel and a touch structure can be integrated. Therefore, flexible multiple layer on cell (FMLOC) touch technology came into being, and FMLOC touch technology is to directly manufacture various electrode layers and various lines of the touch structure on an encapsulation film, thus integrating the touch structure on the display panel. Therefore, the display device adopting FMLOC touch technology can not only realize the lighter and thinner design of the display device, but also realize touching based on flexible display.

Figure 11:
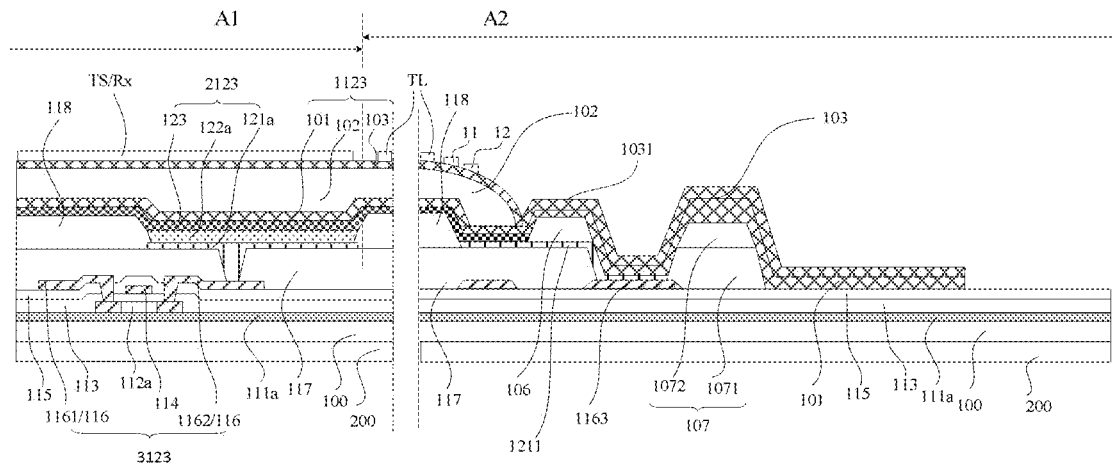
FIG. 11 is a partial cross-sectional view illustrating a touch display substrate provided by an embodiment of the present disclosure.

FIG. 11 is a partial cross-sectional view illustrating a touch display substrate provided by an embodiment of the present disclosure. In an embodiment, as illustrated in FIG. 11, a base substrate 100 is disposed on a support substrate 200, and the base substrate 100 can be a flexible substrate, such as a Polyimide (PI) substrate, but not limited thereto. The material of the base substrate 100 can be selected as needed. The support substrate 200 can be a glass substrate. In some embodiments, the support substrate 200 can be removed. On the base substrate 100, an array of thin film transistors (TFTs) 3123 can be disposed, and only one thin film transistor 3123 is illustrated in FIG. 11. The thin film transistor 3123 can include a semiconductor layer, a gate electrode, a gate insulating layer, a source electrode, and a drain electrode, etc. As illustrated in FIG. 11, a buffer layer 111a, a semiconductor layer 112a, a gate insulating layer 113, a gate electrode 114, an interlayer dielectric layer 115, and a source-drain layer 116 are sequentially disposed on the base substrate 100, the source-drain layer 116 includes a source electrode 1161 and a drain electrode 1162, and the source electrode 1161 and the drain electrode 1162 are spaced apart from each other and can be connected with the semiconductor layer 112*a* through via holes, respectively. A planarization layer 117 can be disposed on the thin film transistor 3123, and a component to be encapsulated (OLED) 2123 can be disposed on the planarization layer 117. The component to be encapsulated (OLED) 2123 can include a first electrode 121*a*, a light-emitting functional layer 122*a*, and a second electrode 123, and the first electrode 121*a* can be electrically connected with the drain electrode 1162 through a via hole penetrating the planarization layer 117. A pixel defining layer 118 can be disposed on the first electrode 121*a* to facilitate the formation of the light-emitting functional layer 122*a*. The second electrode 123 can be electrically connected with an electrode lead 1163 through a connection electrode 1211. The light-emitting functional layer 122*a* can include a light-emitting layer, and can further include other functional layers, for example, can further include at least one selected from the group consisting of a hole injection layer, a hole transport layer, an electron transport layer, and an electron injection layer, etc., but is not limited thereto. For example, the electrode lead 1163 can be formed in the same layer as the source-drain layer 116. The planarization layer 117 can be a resin layer. An encapsulation film 1123 can be formed on the component to be encapsulated (OLED) 2123. The encapsulation film 1123 covers the component to be encapsulated 2123 to prevent water and oxygen from invading the component to be encapsulated 2123. The structure of the component to be encapsulated (OLED) 2123 is not limited thererto. The base substrate 100 in FIG. 11 can be the base substrate BS described above.

As illustrated in FIG. 11, the encapsulation film 1123 is disposed on the base substrate 100, the encapsulation film 1123 includes a first film 101, a second film 102, and a third film 103 that are sequentially away from the base substrate 100, the second film 102 is sandwiched between the first film 101 and the third film 103, and the first film 101 and the third film 103 are in contact with each other at an edge. For example, the first film 101 and the third film 103 can be inorganic thin films, and for example, can be made of an inorganic oxide such as SiNx, SiOx, SiOxNy, SiCxNy, etc., but are not limited thereto. For example, the second film 102 can be an organic thin film, and for example, can be made of an organic material such as resin, etc., but is not limited thereto. The resin can be, for example, a thermosetting resin, and the thermosetting resin includes, for example, an epoxy resin, but is not limited thereto. The resin can be, for example, a thermoplastic resin, the thermoplastic resin includes, for example, an acrylic (PMMA) resin, but is not limited thereto. For example, the first film 101 and the third film 103 can be manufactured by chemical vapor deposition (CVD), and the second film 102 can be manufactured by ink jet printing (IJP). The first film 101 and the third film 103 can both serve as water-proof layers. For example, the first film 101 can include a plurality of stacked sub-layers, and the second film 102 and the third film 103 can also include a plurality of stacked sub-layers, respectively.

FIG. 11 further illustrates a first dam 106 and a second dam 107. The first dam 106 can be formed in the same layer as the pixel defining layer 118. The second dam 107 can include a first sub-dam 1071 and a second sub-dam 1072. For example, the first sub-dam 1071 can be formed in the same layer as the planarization layer 117, and the second sub-dam 1072 can be formed in the same layer as the pixel defining layer 118.

As illustrated in FIG. 11, the second film 102 is located between the first film 101 and the third film 103, and the first film 101 and the third film 103 are in contact with each other at an edge to form a contacting part 1031.

FIG. 11 also illustrates a display region A1 and a peripheral region A2. As illustrated in FIG. 11, the touch structure TS is located in the display region A1, and the touch line TL is located in the peripheral region A2. As illustrated in FIG. 11, an orthographic projection of the touch line TL on the base substrate 100 falls within an orthographic projection of the second film 102 on the base substrate 100.

In the touch display substrate illustrated in FIG. 11, an orthographic projection of the first ground line 11 on the base substrate 100 falls within an orthographic projection of the second film 102 on the base substrate 100. For example, as illustrated in FIG. 11, an orthographic projection of the second ground line 12 on the base substrate 100 falls within the orthographic projection of the second film 102 on the base substrate 100. In the case where a plurality of second ground lines 12 are provided, an orthographic projection of the plurality of second ground lines 12 on the base substrate 100 falls within the orthographic projection of the second film 102 on the base substrate 100.

Figure 12:
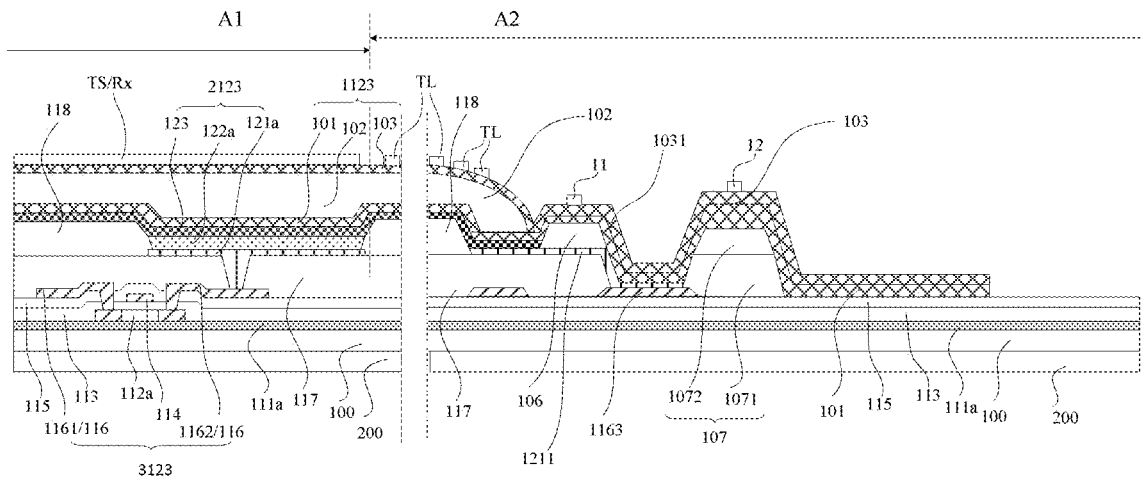
FIG. 12 is a partial cross-sectional view illustrating a touch display substrate provided by another embodiment of the present disclosure.

FIG. 12 is a partial cross-sectional view illustrating a touch display substrate provided by another embodiment of the present disclosure. Compared with the touch display substrate illustrated in FIG. 11, the touch display substrate illustrated in FIG. 12 adjusts the arrangement positions of the first ground line 11 and the second ground line 12. In the touch display substrate illustrated in FIG. 12, the orthographic projection of the first ground line 11 on the base substrate 100 is located outside the orthographic projection of the second film 102 on the base substrate 100. For example, as illustrated in FIG. 12, the orthographic projection of the second ground line 12 on the base substrate 100 is located outside the orthographic projection of the second film 102 on the base substrate 100. In the case where a plurality of second ground lines 12 are provided, the orthographic projection of the plurality of second grounding lines 12 on the base substrate 100 is located outside the orthographic projection of the second film 102 on the base substrate 100.

For example, as illustrated in FIG. 12, the orthographic projection of the second ground line 12 on the base substrate 100 falls within the orthographic projection of the contacting part 1031 on the base substrate 100.

For further example, as illustrated in FIG. 12, the orthographic projection of the first ground line 11 on the base substrate 100 falls within the orthographic projection of the first dam 106 on the base substrate 100. For example, as illustrated in FIG. 12, the orthographic projection of the second ground line 12 on the base substrate 100 falls within the orthographic projection of the second dam 107 on the base substrate 100.

At least one embodiment of the present disclosure further provides a touch display device, which includes any one of the above touch display substrates.

In the embodiment of the present disclosure, the touch display device includes a flexible multi-layer on cell (FM-LOC) product, but is not limited thereto. The touch display device can be a display device, such as a liquid crystal display, an electronic paper, an OLED (organic light-emitting diode) display, etc., and any product or component which includes the display device and has touch and display functions, such as a television, a digital camera, a mobile phone, a watch, a tablet computer, a notebook computer, and a navigator, etc.

For example, in the embodiment of the present disclosure, the above-mentioned distance can refer to spacing. For example, the first distance D1, the second distance D2, the distance D, and the third distance D3 can refer to spacings, respectively.

Figure 13A:
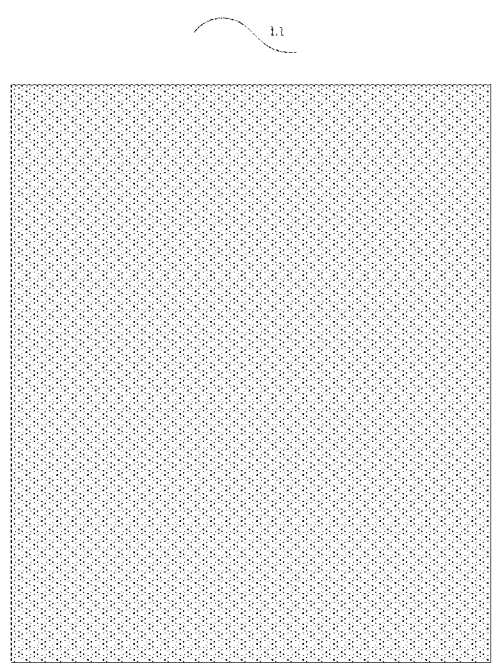
FIGS. 13A-13F are flowcharts of a manufacturing method of a touch substrate provided by an embodiment of the present disclosure.
Figure 13B:
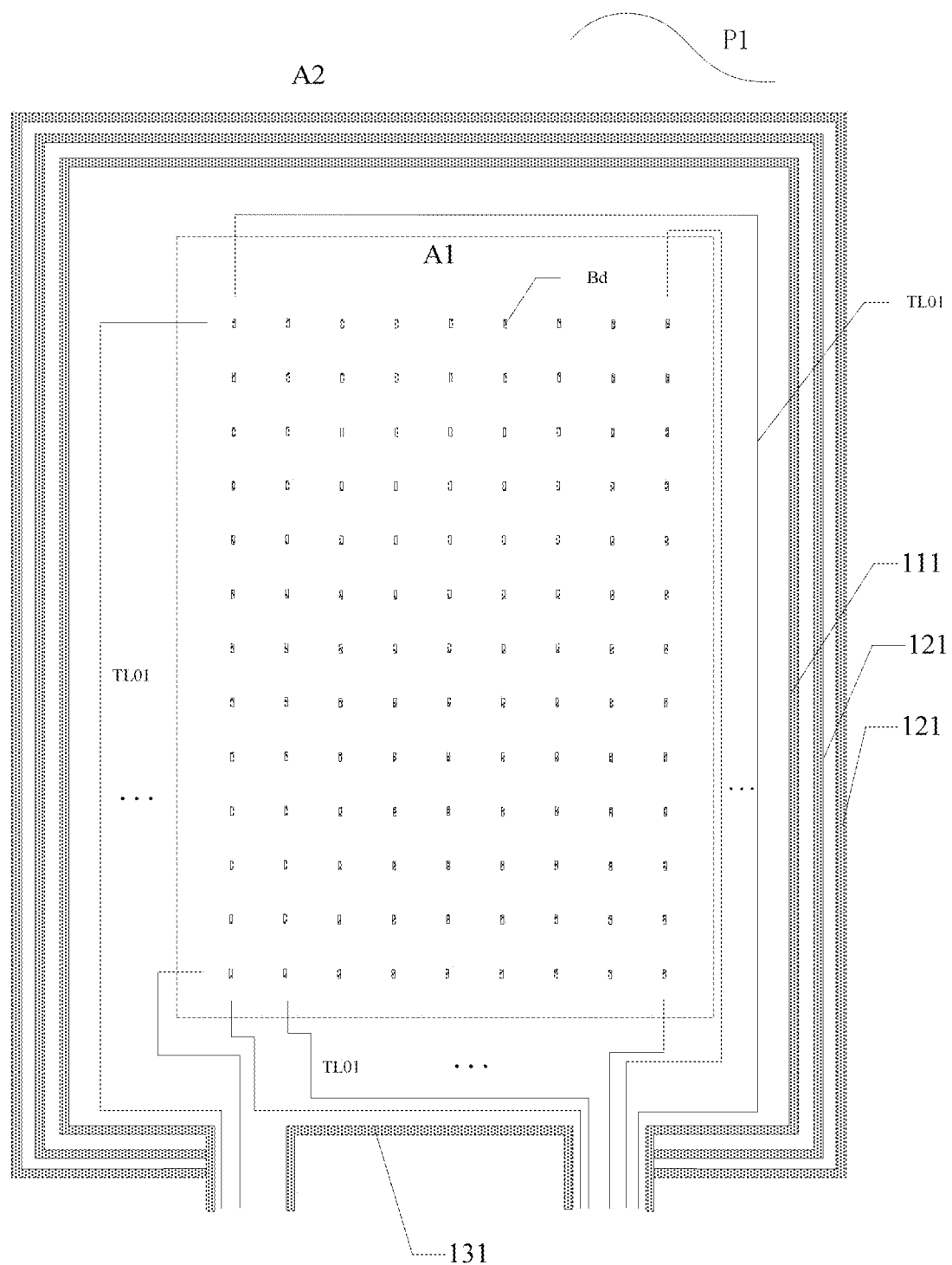
Figure 13C:
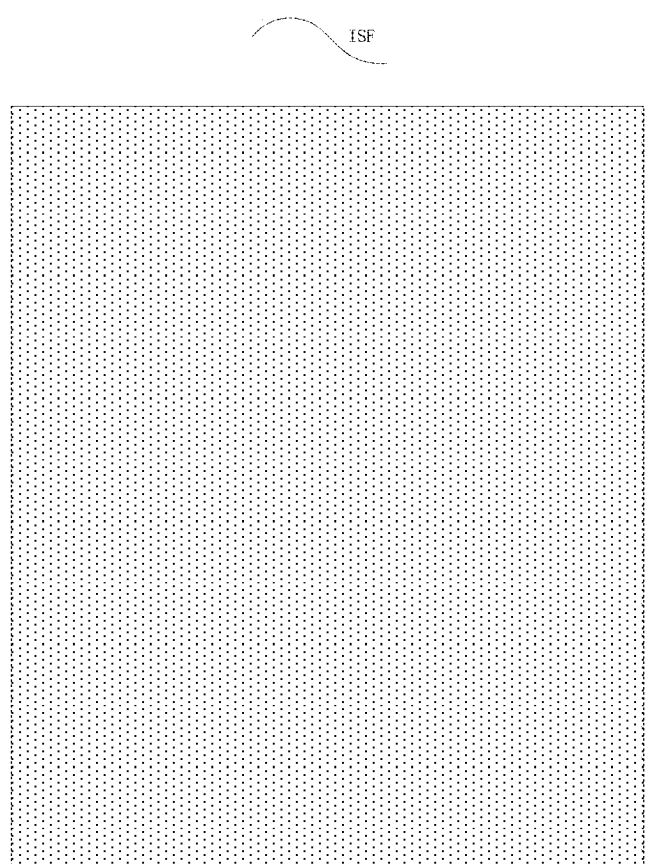
Figure 13D:
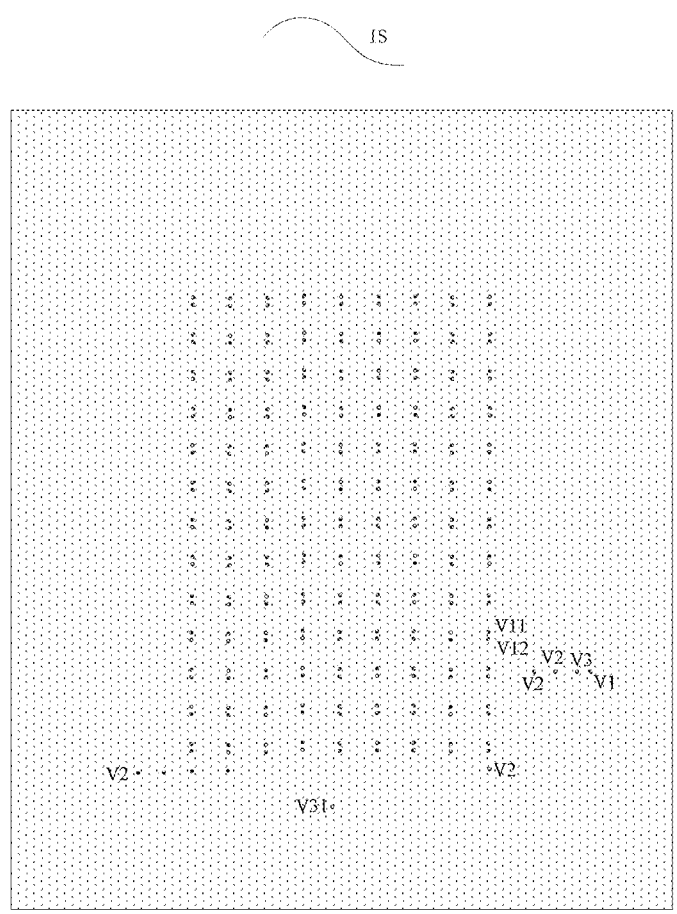
Figure 13E:
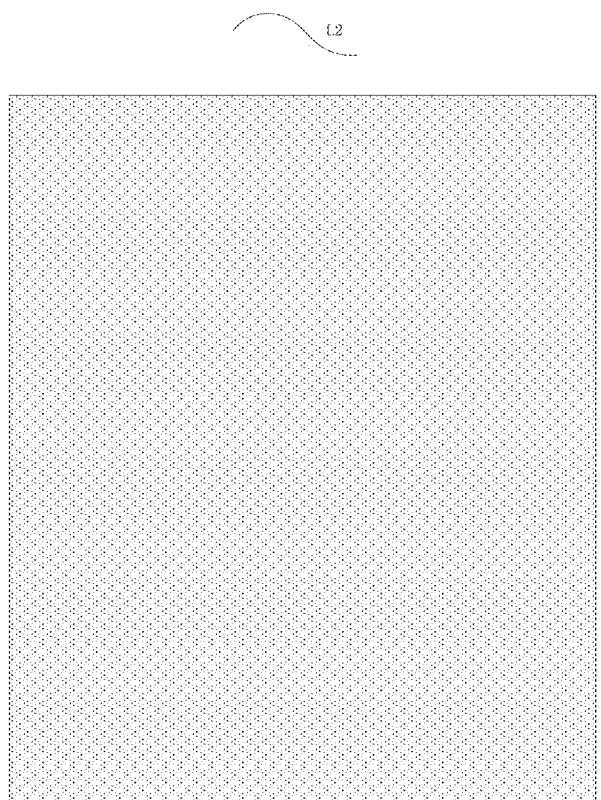
Figure 13F:
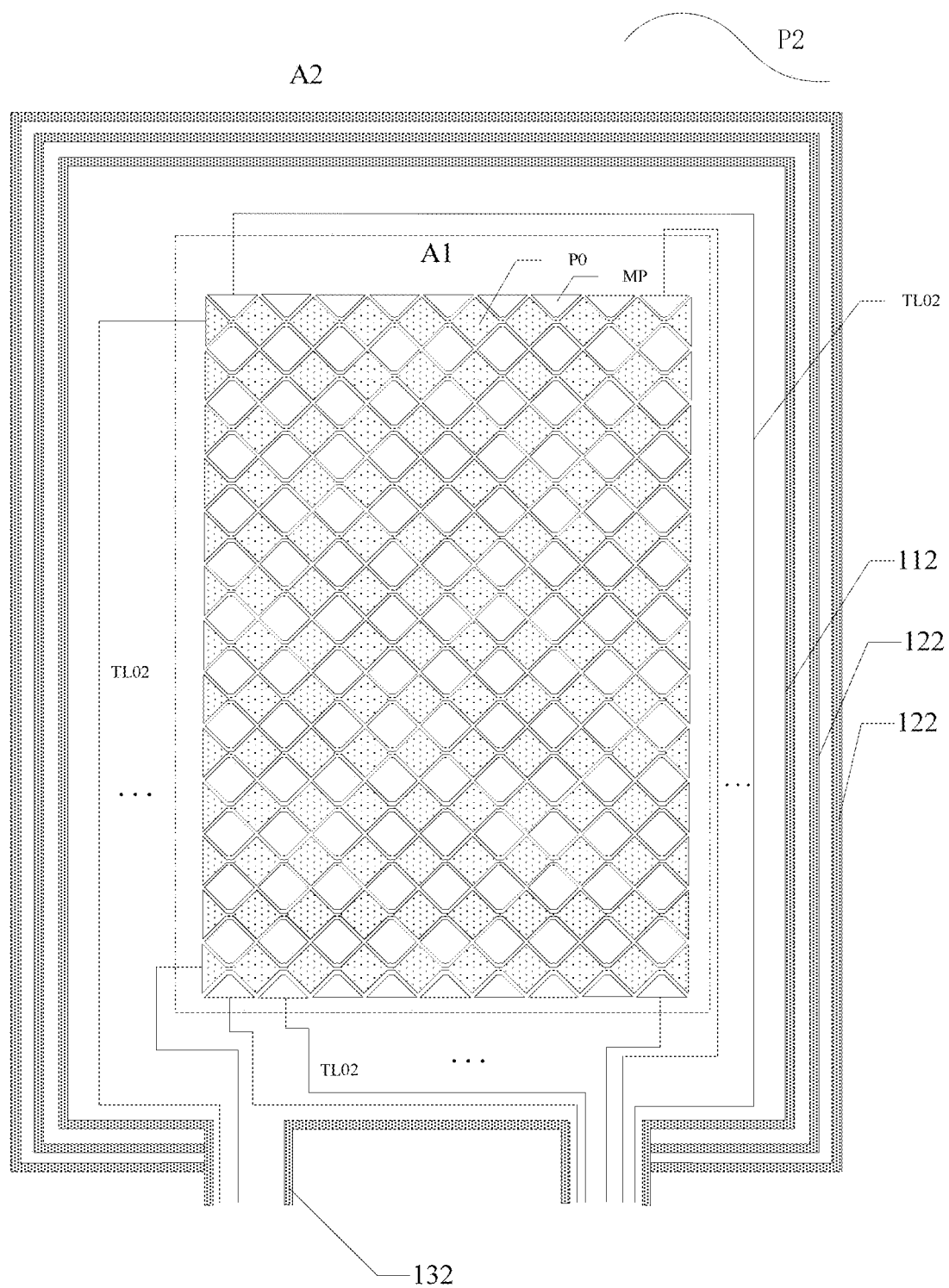

At least one embodiment of the present disclosure further provides a manufacturing method of a touch substrate, as illustrated in FIGS. 13A-13F, which includes the following steps.
(1) As illustrated in FIG. 13A, forming a first conductive film L1 on a base substrate.
(2) As illustrated in FIG. 13B, patterning the first conductive film L1 to form a first pattern P1, the first pattern P1 includes a bridge line Bd, a first touch sub-line TL01, a first ground sub-line 121, a third ground sub-line 111, and a fifth ground sub-line 131.
(3) As illustrated in FIG. 13C, forming an insulating film ISF.
(4) As illustrated in FIG. 13D, forming a first via hole V1, a second via hole V2, a third via hole V3, a fourth via hole V11, a fifth via hole V12, and a sixth via hole V31 in the insulating film ISF.
(5) As illustrated in FIG. 13E, forming a second conductive film L2.
(6) As illustrated in FIG. 13F, patterning the second conductive film L2 to form a second pattern p2; the second pattern P2 includes a second touch sub-line TL02, a second ground sub-line 122, a fourth ground sub-line 112, an integrally formed portion P0, a main portion MP, and a sixth ground sub-line 132; the first ground sub-line 121 and the second ground sub-line 122 are connected through the first via hole V1 to form a second ground line 12, the first touch sub-line TL01 and the second touch sub-line TL02 are connected through the second via hole V2 to form a touch line TL, the third ground sub-line 111 and the fourth ground sub-line 112 are connected through the third via hole V3 to form a first ground line 11, and adjacent main portions MP are connected with the bridge line Bd through the fourth via hole V11 and the fifth via hole V12, respectively, so as to form a second sensor pattern SP2; the integrally formed portion P0 is a first sensor pattern SP1; and the fifth ground sub-line 131 and the sixth ground sub-line 132 are connected through the sixth via hole V31 to form a third ground line 13.
(7) Bonding an FPC 20 to the touch substrate by way of pressure welding.

The above description takes the formation of the touch substrate illustrated in FIG. 9 as an example. In the case where the third ground line 13 is not provided, the steps of forming the fifth ground sub-line 131, the sixth ground sub-line 132, and the sixth via hole V31 are correspondingly removed. The method is described below.

Another embodiment of the present disclosure also provides a manufacturing method of a touch substrate, which can also refer to FIGS. 13A-13F, and includes the following steps.
(1) As illustrated in FIG. 13A, forming a first conductive film L1 on a base substrate.
(2) As illustrated in FIG. 13B, patterning the first conductive film L1 to form a first pattern P1; the first pattern P1 includes a bridge line Bd, a first touch sub-line TL01, a first ground sub-line 121, and a third ground sub-line 111.
(3) As illustrated in FIG. 13C, forming an insulating film ISF.
(4) As illustrated in FIG. 13D, forming a first via hole V1, a second via hole V2, a third via hole V3, a fourth via hole V11, and a fifth via hole V12 in the insulating film ISF, so as to form an insulating layer IS.
(5) As illustrated in FIG. 13E, forming a second conductive film L2.
(6) As illustrated in FIG. 13F, patterning the second conductive film L2 to form a second pattern p2; the second pattern P2 includes a second touch sub-line TL02, a second ground sub-line 122, a fourth ground sub-line 112, an integrally formed portion P0, and a main portion MP; the first ground sub-line 121 and the second ground sub-line 122 are connected through the first via hole V1 to form a second ground line 12, the first touch sub-line TL01 and the second touch sub-line TL02 are connected through the second via hole V2 to form a touch line TL, the third ground sub-line 111 and the fourth ground sub-line 112 are connected through the third via hole V3 to form a first ground line 11, and adjacent main portions MP are connected with the bridge line Bd through the fourth via hole V11 and the fifth via hole V12, respectively, so as to form a second sensor pattern SP2; and the integrally formed portion P0 is a first sensor pattern SP1.
(7) Bonding an FPC 20 to the touch substrate by way of pressure welding.

For the sake of clarity, all touch lines TL are not illustrated in FIGS. 13A-13F, and only seven touch lines TL are schematically illustrated in FIGS. 13A-13F. In the embodiment of the present disclosure, two touch lines TL are provided at the upper and lower sides of the second sensor pattern SP2, respectively, while only one touch line TL is provided at the left side of the first sensor pattern SP1.

Of course, the number and shape of the first sensor patterns SP1 and the number and shape of the second sensor patterns SP2 are not limited to those illustrated in the figures, but can be determined as needed. And the number of the second ground lines 12 is not limited to that illustrated in the figures.

For example, the insulating film ISF can be made of an insulating material, such as silicon oxide, silicon nitride, silicon oxynitride, or resin, etc., but is not limited thereto.

For example, the first conductive film L1 and the second conductive film L2 can be made of a metal material, but are not limited thereto.

It should be noted that, for the sake of clarity, the thickness of a layer or region is enlarged in the drawings for describing the embodiments of the present disclosure. It should be understood that in the case where an element such as a layer, film, region or substrate is referred to as being "on" or "under" another element, the element may be "directly" "on" or "under" the another element, or an intervening element may be present therebetween.

In the embodiments of the present disclosure, the elements arranged in the same layer are formed by performing one single patterning process on the same film layer. For example, the elements arranged in the same layer are located on a surface of the same element facing away from the base substrate, but are not limited to this case. The elements arranged in the same layer can have different heights with respect to the base substrate.

In the embodiments of the present disclosure, the patterning or patterning process can include only a photolithography process, or can include a photolithography process and an etching process, or can include other processes for forming a predetermined pattern such as printing, inkjet, etc. The photolithography process refers to a process including film formation, exposure, development, etc., which uses a photoresist, a mask, an exposure machine, etc., to form a pattern. A corresponding patterning process can be selected according to the structure to be formed in the embodiments of the present disclosure.

In case of no conflict, features in one embodiment or in different embodiments can be combined.

What have been described above are only specific implementations of the present disclosure, the protection scope of the present disclosure is not limited thereto. Any changes or substitutions easily occur to those skilled in the art within the technical scope of the present disclosure should be covered in the protection scope of the present disclosure. Therefore, the protection scope of the present disclosure should be based on the protection scope of the claims.

What is claimed is:

1. A touch substrate, comprising: a touch structure, comprising a sensor pattern and a touch line, wherein the sensor pattern comprises a plurality of first sensor patterns and a plurality of second sensor patterns, the plurality of first sensor patterns are intersected with and insulated from the plurality of second sensor patterns, and the touch line comprises a plurality of first touch lines and a plurality of second touch lines, each of the plurality of first sensor patterns is connected with at least one of the first touch lines, and each of the plurality of second sensor patterns is connected with at least one of the second touch lines; a first ground line, located at a periphery of the touch structure; and at least one second ground line, located at a side of the first ground line facing away from the touch structure, wherein the first ground line and the at least one second ground line are connected at a side of the touch structure and are connected with one ground connection line, wherein the at least one second ground line comprises two second ground lines, one of the two second ground lines is located at a side of the other one of the two second ground lines facing away from the touch structure, and the two second ground lines are connected with the ground connection line; and the touch substrate further comprises a flexible printed circuit, wherein one end of the ground connection line is directly connected with the flexible printed circuit.

2. The touch substrate according to claim 1, wherein the first ground line and the other one of the two second ground lines have a first connection point, the ground connection line has a first endpoint, and the first connection point coincides with the first endpoint.

3. The touch substrate according to claim 2, wherein the first ground line and the other one of the two second ground lines are connected with the ground connection line at the first connection point.

4. The touch substrate according to claim 2, wherein the first ground line and the one of the two second ground lines have a second connection point, and the second connection point is located at the ground connection line.

5. The touch substrate according to claim 4, wherein the first ground line and the one of the two second ground lines are connected with the ground connection line at the second connection point.

6. The touch substrate according to claim 5, wherein a minimum distance between the first connection point and the second connection point is greater than zero.

7. The touch substrate according to claim 2, wherein two first connection points are provided, the touch substrate has a first center line, the two first connection points are located at two sides of the first center line, respectively, the first center line extends in a direction the same as an extending direction of the second sensor pattern.

8. The touch substrate according to claim 7, further comprising a second center line, wherein the second center line is intersected with the first center line, the two first connection points are located at the same side of the second center line.

9. The touch substrate according to claim 1, wherein a width of the first ground line is the same as a width of the ground connection line, the width of the first ground line is a size of the first ground line in a direction perpendicular to an extending direction of the first ground line and in a plane parallel with a base substrate, and the width of the ground connection line is a size of the ground connection line in a direction perpendicular to an extending direction of the ground connection line and in the plane parallel with the base substrate.

10. The touch substrate according to claim 1, wherein a width of the first ground line is greater than a width of the ground connection line, the width of the first ground line is a size of the first ground line in a direction perpendicular to an extending direction of the first ground line and in a plane parallel with the base substrate, and the width of the ground connection line is a size of the ground connection line in a direction perpendicular to an extending direction of the ground connection line and in a plane parallel with the base substrate.

11. The touch substrate according to claim 1, wherein the first ground line is insulated from the touch structure, and the second ground line is insulated from the touch structure.

12. The touch substrate according to claim 1, wherein a maximum distance between the first ground line and the second ground line is in a range of 20-50 μm.

13. The touch substrate according to claim 1, wherein a distance between the first ground line and the touch line that is closest to the first ground line is in a range of 10-40 μm.

14. The touch substrate according to claim 1, wherein a width of the first ground line is in a range of 15-20 μm.

15. The touch substrate according to claim 1, wherein a width of one of the at least one second ground line is in a range of 15-20 μm.

16. The touch substrate according to claim 1, wherein the first ground line is arranged around the touch structure, the second ground line is arranged around the first ground line, and the first ground line and the second ground line have a first interval.

17. The touch substrate according to claim 1, further comprising a flexible printed circuit, wherein two ground connection lines are provided, the two ground connection lines are directly connected with different pins of the flexible printed circuit.

18. A touch display substrate, comprising the touch substrate according to claim 1.

19. A touch substrate, comprising:
a touch structure, comprising a sensor pattern and a touch line, wherein the sensor pattern comprises a plurality of first sensor patterns and a plurality of second sensor patterns, the plurality of first sensor patterns are intersected with and insulated from the plurality of second sensor patterns, and the touch line comprises a plurality of first touch lines and a plurality of second touch lines, each of the plurality of first sensor patterns is connected with at least one of the first touch lines, and each of the plurality of second sensor patterns is connected with at least one of the second touch lines;
a first ground line, located at a periphery of the touch structure; and
at least one second ground line, located at a side of the first ground line facing away from the touch structure, wherein the first ground line and the at least one second ground line are connected at a side of the touch structure and are connected with one ground connection line, wherein a width of one of the at least one second ground line is greater than a width of the ground connection line, the width of the second ground line is a size of the second ground line in a direction perpendicular to an extending direction of the second ground line and in a plane parallel with the base substrate, and the width of the ground connection line is a size of the ground connection line in a direction perpendicular to an extending direction of the ground connection line and in a plane parallel with the base substrate.

20. A touch substrate, comprising:

a touch structure, comprising a sensor pattern and a touch line, wherein the sensor pattern comprises a plurality of first sensor patterns and a plurality of second sensor patterns, the plurality of first sensor patterns are intersected with and insulated from the plurality of second sensor patterns, and the touch line comprises a plurality of first touch lines and a plurality of second touch lines, each of the plurality of first sensor patterns is connected with at least one of the first touch lines, and each of the plurality of second sensor patterns is connected with at least one of the second touch lines;

a first ground line, located at a periphery of the touch structure; and at least one second ground line, located at a side of the first ground line facing away from the touch structure, wherein the first ground line and the at least one second ground line are connected at a side of the touch structure and are connected with one ground connection line, wherein the second ground line comprises a first ground sub-line and a second ground sub-line, an insulating layer is arranged between the first ground sub-line and the second ground sub-line, the first ground sub-line and the second ground sub-line are connected through a first via hole penetrating the insulating layer.

21. The touch substrate according to claim 20, further comprising a flexible printed circuit, wherein one end of the ground connection line is directly connected with the flexible printed circuit.

22. The touch substrate according to claim 20, wherein at least one of the first touch line and the second touch line comprises a first touch sub-line and a second touch sub-line, the insulating layer is arranged between the first touch sub-line and the second touch sub-line, the first touch sub-line and the second touch sub-line are connected through a second via hole penetrating the insulating layer.

23. The touch substrate according to claim 22, wherein one of the first sensor pattern and the second sensor pattern comprises an integrally formed portion, and the other of the first sensor pattern and the second sensor pattern comprises a main portion and a bridge line, one of the main portion and the bridge line is in a same layer as the first ground sub-line, and the other of the main portion and the bridge line is in a same layer as the second ground sub-line.

24. The touch substrate according to claim 23, wherein the first ground line comprises a third ground sub-line and a fourth ground sub-line, the insulating layer is arranged between the third ground sub-line and the fourth ground sub-line, the third ground sub-line and the fourth ground sub-line are connected through a third via hole penetrating the insulating layer.

25. The touch substrate according to claim 24, wherein the bridge line, the first ground sub-line, the third ground sub-line, and the first touch sub-line are in a same layer, and the integrally formed portion, the main portion, the second ground sub-line, the fourth ground sub-line, and the second touch sub-line are in a same layer.

26. The touch substrate according to claim 25, wherein at least one selected from the group consisting of the bridge line, the integrally formed portion, and the main portion has a metal mesh structure.

* * * * *